(12) United States Patent
Kang et al.

(10) Patent No.: US 10,937,815 B2
(45) Date of Patent: Mar. 2, 2021

(54) LIGHT EMITTING DIODE DISPLAY DEVICE

(71) Applicant: LG DISPLAY CO., LTD., Seoul (KR)

(72) Inventors: HanSaem Kang, Paju-si (KR); HyeonHo Son, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/808,733

(22) Filed: Mar. 4, 2020

(65) Prior Publication Data
US 2020/0203392 A1 Jun. 25, 2020

Related U.S. Application Data

(63) Continuation of application No. 16/123,694, filed on Sep. 6, 2018, now Pat. No. 10,615,186, which is a (Continued)

(30) Foreign Application Priority Data

Oct. 28, 2016 (KR) .................. 10-2016-0141673

(51) Int. Cl.
| | |
|---|---|
| *H01L 27/12* | (2006.01) |
| *H01L 33/08* | (2010.01) |
| *H01L 25/075* | (2006.01) |
| *H01L 25/16* | (2006.01) |
| *H01L 33/48* | (2010.01) |

(Continued)

(52) U.S. Cl.
CPC ...... *H01L 27/1248* (2013.01); *H01L 25/0753* (2013.01); *H01L 25/167* (2013.01); *H01L 27/124* (2013.01); *H01L 33/08* (2013.01); *H01L 33/486* (2013.01); *H01L 33/502* (2013.01); *H01L 33/505* (2013.01); *H01L 33/54* (2013.01);
(Continued)

(58) Field of Classification Search
CPC ............... H01L 27/1248; H01L 27/124; H01L 25/0753; H01L 25/167; H01L 33/08; H01L 33/486; H01L 33/502; H01L 33/505; H01L 33/54; H01L 33/60; H01L 33/52; H01L 33/62
USPC ......................................................... 257/72
See application file for complete search history.

(56) References Cited

U.S. PATENT DOCUMENTS

| | | | |
|---|---|---|---|
| 7,943,934 B2 | 5/2011 | Yoon et al. | |
| 8,698,147 B2 | 4/2014 | Choi et al. | |

(Continued)

FOREIGN PATENT DOCUMENTS

| | | |
|---|---|---|
| JP | 2003-150075 A | 5/2003 |
| KR | 10-2013-0137985 A | 12/2013 |

*Primary Examiner* — Tu-Tu V Ho
(74) *Attorney, Agent, or Firm* — Birch, Stewart, Kolasch & Birch, LLP

(57) ABSTRACT

A display device according to an embodiment includes a substrate, a gate line and a data line on the substrate, a pixel connected to the gate line and the data line and including a thin film transistor (TFT) on the substrate, a planarization layer on the TFT, and a light emitting device including a first electrode and a second electrode, wherein the light emitting device comprises a first portion and a second portion opposite to the first portion, the first portion including the first and second electrodes, wherein the TFT comprises a gate electrode, a semiconductor layer, a source electrode, and a drain electrode, and wherein the first portion of the light emitting device is not overlapped with the TFT.

20 Claims, 7 Drawing Sheets

Related U.S. Application Data continuation of application No. 15/794,741, filed on Oct. 26, 2017, now Pat. No. 10,090,335.

(51) Int. Cl.
  *H01L 33/50* (2010.01)
  *H01L 33/54* (2010.01)
  *H01L 33/60* (2010.01)
  *H01L 33/52* (2010.01)
  *H01L 33/62* (2010.01)

(52) U.S. Cl.
  CPC .............. *H01L 33/60* (2013.01); *H01L 33/52* (2013.01); *H01L 33/62* (2013.01)

(56) References Cited

U.S. PATENT DOCUMENTS

| | | |
|---|---|---|
| 9,472,734 B1 | 10/2016 | Chen et al. |
| 9,865,662 B2 * | 1/2018 | Kim .................. H01L 27/326 |
| 2008/0024402 A1 | 1/2008 | Nishikawa et al. |
| 2008/0311351 A1 | 12/2008 | Hsu et al. |
| 2009/0322657 A1 | 12/2009 | Na et al. |
| 2014/0159043 A1 | 6/2014 | Sakariya et al. |
| 2014/0306229 A1 | 10/2014 | Ono |
| 2015/0084054 A1 | 3/2015 | Fan et al. |
| 2016/0087018 A1 | 3/2016 | Shim et al. |
| 2016/0218318 A1 | 7/2016 | Chung et al. |
| 2018/0190625 A1 | 7/2018 | Steckel et al. |

* cited by examiner

LIGHT EMITTING DIODE DISPLAY DEVICE

CROSS-REFERENCE TO RELATED APPLICATIONS

This Application is a Continuation of co-pending U.S. patent application Ser. No. 16/123,694 filed on Sep. 6, 2018, which is a Continuation of U.S. patent application Ser. No. 15/794,741 filed on Oct. 26, 2017 (now U.S. Pat. No. 10,090,335 issued on Oct. 2, 2018), which claims the priority benefit under 35 U.S.C. § 119(a) to Korean Patent Application No. 10-2016-0141673 filed in the Republic of Korea on Oct. 28, 2016, all of these applications are hereby expressly incorporated by reference into the present application.

BACKGROUND OF THE INVENTION

Field of the Invention

Embodiments of the present disclosure relate to a display device, and more particularly, to a light emitting diode display device.

Discussion of the Related Art

Display devices are being widely used as a display screen of notebook computers, tablet computers, smartphones, portable display devices, and portable information devices in addition to a display screen of television (TVs) and monitors.

Liquid crystal display (LCD) devices and organic light emitting display devices display an image by using thin film transistors (TFTs) as switching elements. Since the LCD devices cannot self-emit light, the LCD devices display an image by using light emitted from a backlight unit which is disposed under a liquid crystal display panel. Since the LCD devices include a backlight unit, a design of the LCD devices is limited, and luminance and a response time are reduced. Since the organic light emitting display devices include an organic material, the organic light emitting display devices are vulnerable to water, causing a reduction in reliability and lifetime.

Recently, research and development on light emitting diode display devices including a micro light emitting device are being done. The light emitting diode display devices have high image quality and high reliability, and thus, are attracting much attention as next-generation display devices.

However, in a related art light emitting diode display device, much time is taken in heating or cooling a substrate for bonding a light emitting device to a pixel circuit with a conductive adhesive in a process of mounting a micro light emitting device on a TFT array substrate, and for this reason, productivity is reduced.

SUMMARY OF THE INVENTION

Accordingly, the embodiments of the present disclosure are directed to provide a light emitting diode display device that substantially obviates one or more problems due to limitations and disadvantages of the related art.

An aspect of the present disclosure is directed to provide a light emitting diode display device in which a process time taken in a process of connecting a light emitting device to a pixel circuit is shortened.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is a light emitting diode display device including a pixel including a driving TFT on a substrate, a first layer covering the pixel, a concave portion in the first layer, a light emitting device in the concave portion and including a first electrode and a second electrode, a second layer covering the first layer and the light emitting device, a pixel electrode electrically connected to the driving TFT and the first electrode of the light emitting device, and a common electrode electrically connected to the second electrode of the light emitting device, wherein the pixel electrode is on the second layer.

The concave portion may be concavely from the first layer.

The pixel electrode may be electrically connected to a source electrode of the driving TFT through a first circuit contact hole in the first and second layers and may be electrically connected to the first electrode of the light emitting device through a first electrode contact hole in the second layer.

The common electrode may be electrically connected to the second electrode of the light emitting device through a second electrode contact hole in the second layer.

In another aspect of the present disclosure, there is a display device comprising: a first substrate; a pixel including a driving thin film transistor (TFT) on the first substrate; a first layer covering the pixel; a concave portion in the first layer; a light emitting device in the concave portion, the light emitting device including a first electrode and a second electrode; a second layer covering the first layer and the light emitting device; a pixel electrode electrically connected to the driving TFT and the first electrode of the light emitting device; a common electrode electrically connected to the second electrode of the light emitting device; and a second substrate, wherein the first and second electrodes in the concave portion are disposed to face the second substrate without being disposed to face a floor surface of the concave portion.

It is to be understood that both the foregoing general description and the following detailed description of the present disclosure are by example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
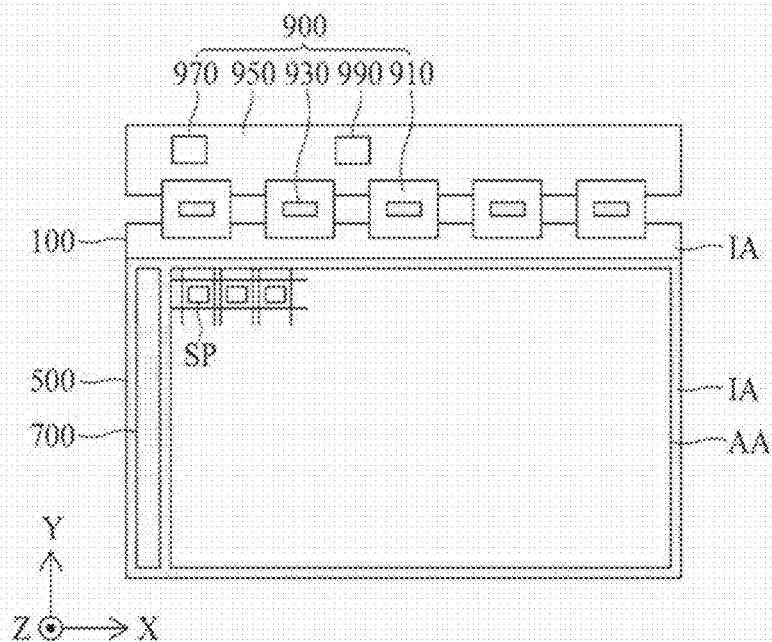
FIG. 1 is a diagram for describing a configuration of a light emitting diode display device according to an embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of the claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In an instance where 'comprise', 'have', and 'include' described in the present specification are used, another part may be added unless 'only~' is used. The terms of a singular form may include plural forms unless referred to the contrary.

In construing an element, the element is construed as including an error range although there may be no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~' and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is strictly vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, example embodiments of a light emitting diode display device according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
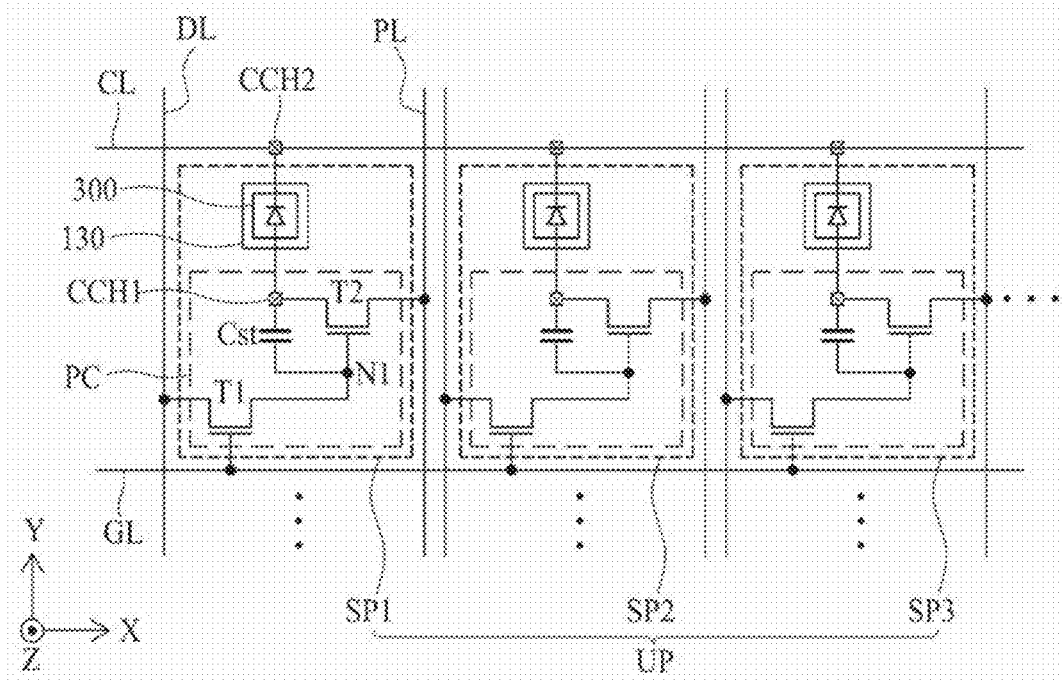
FIG. 2 is a circuit diagram for describing a configuration of a pixel illustrated in FIG. 1.

FIG. 1 is a diagram for describing a configuration of a light emitting diode display device according to an embodiment of the present disclosure, and FIG. 2 is a circuit diagram for describing a configuration of a pixel illustrated in FIG. 1. All the components of the light emitting diode display device according to all embodiments of the present disclosure are operatively coupled and configured.

Referring to FIGS. 1 and 2, the light emitting diode display device according to an embodiment of the present disclosure may include a first substrate 100, a plurality of light emitting devices 300, and a second substrate 500.

The first substrate 100 may be a thin film transistor (TFT) array substrate and may be formed of glass, a plastic material, and/or the like. The first substrate 100 according to an embodiment may include a display area (or an active area) AA and a non-display area (or an inactive area) IA.

The display area AA may be provided in a portion other than an edge of the first substrate 100. The display area AA may be defined as an area where a pixel array displaying an image is provided.

The non-display area IA may be provided in a portion other than the display area AA provided on the substrate 100 and may be defined as the edge of the first substrate 100 surrounding the display area AA. The non-display area IA may be a peripheral portion outside the display area AA and cannot display an image unlike the display area AA, and moreover, the non-display area IA may be defined as an area where lines and circuits for driving the pixel array are disposed. For example, the non-display area IA may include a first non-display area defined in a peripheral portion outside an upper side of the display area AA, a second non-display area defined in a peripheral portion outside a lower side of the display area AA, a third non-display area defined in a peripheral portion outside a left side of the display area AA, and a fourth non-display area defined in a peripheral portion outside a right side of the display area AA.

The first substrate 100 according to an embodiment may include a plurality of gate lines GL, a plurality of data lines DL, a plurality of driving power lines PL, a plurality of common power lines CL, a plurality of pixels SP, and a plurality of concave portions 130.

The plurality of gate lines GL may be provided on the first substrate 100, may long extend along a first horizontal axis direction X of the first substrate 100, may be arranged along a second horizontal axis direction Y, and may be spaced apart from each other by a certain interval. In this instance, the first horizontal axis direction X may be defined as a direction parallel to a long side length direction of the first substrate 100, and the second horizontal axis direction Y may be defined as a direction parallel to a short side length direction of the first substrate 100. Alternatively, each of the first horizontal axis direction X and the second horizontal axis direction Y may be defined as a direction opposite thereto.

The plurality of data lines DL may be provided on the first substrate 100 to intersect the plurality of gate lines GL, may long extend along the second horizontal axis direction Y of the first substrate 100, may be arranged along the first horizontal axis direction X, and may be spaced apart from each other by a certain interval.

The plurality of driving power lines PL may be provided on the first substrate 100 in parallel with the plurality of data lines DL and may be formed along with the plurality of data lines DL. Each of the plurality of driving power lines PL may supply a pixel driving power, supplied from the outside, to an adjacent pixel SP.

The plurality of driving power lines PL may be connected in common to one first driving power common line provided in the first non-display area of the first substrate 100 in parallel with the gate line GL. The one first driving power common line may distribute the pixel driving power, supplied from the outside, to the plurality of driving power lines PL. The first driving power common line may be provided on the same layer as the gate line GL, electrically disconnected from each of the plurality of data lines DL, and electrically connected to an end of each of the plurality of driving power lines PL through a via hole.

In addition, the pixel driving power may be supplied to one end and another end of each of the plurality of driving power lines PL. To this end, the one end of each of the plurality of driving power lines PL may be connected to the one first driving power common line provided in the first non-display area of the first substrate 100, and the other end of each of the plurality of driving power lines PL may be connected to the one second driving power common line provided in the second non-display area of the first substrate 100. In this instance, according to an embodiment of the present disclosure, the pixel driving power may be applied to an upper end and a lower end of each of the plurality of driving power lines PL through the first and second driving power common lines, thereby minimizing the voltage drop of the pixel driving power which occurs in each of the plurality of driving power lines PL due to a position-based line resistance of each of the plurality of driving power lines PL.

The first and second driving power common lines may be provided on the same layer as the plurality of gate lines GL and may be electrically connected to the end of each of the plurality of driving power lines PL through the via hole.

The plurality of common power lines CL may be arranged on the first substrate 100 in parallel with the plurality of gate lines GL and may be formed along with the plurality of gate lines GL. Each of the plurality of common power lines CL may supply a common power, supplied from the outside, to an adjacent pixel SP. Each of the plurality of common power lines CL may be individually supplied with the common power from a panel driver 900. In this instance, the panel driver 900 may individually control a voltage level of the common power supplied to each of the plurality of common power lines CL to compensate for an electrical characteristic of the light emitting devices 300 and/or an electrical characteristic change of a below-described driving TFT.

In addition, the plurality of common power lines CL may be connected in common to a common power supply line provided in at least one of the third and fourth non-display areas of the first substrate 100. The common power supply line may distribute the common power, supplied from the outside, to the plurality of common power lines CL. The common power supply line may be provided on the same layer as the data lines DL, electrically disconnected from each of the plurality of gate lines GL, and electrically connected to an end of each of the plurality of common power lines CL through a via hole.

The plurality of pixels SP may be respectively provided in a plurality of pixel areas defined by intersections of the gate lines GL and the data lines DL. Each of the plurality of pixels SP may be an area corresponding to a minimum unit where light is actually emitted, and may be defined as a subpixel. At least three adjacent pixels SP may configure one unit pixel UP for displaying colors. For example, the one unit pixel UP may include a red pixel SP1, a green pixel SP2, and a blue pixel SP3 which are adjacent to each other, and may further include a white pixel for enhancing luminance.

Each of the plurality of pixels SP may include a pixel circuit PC.

Each pixel circuit PC may be provided in a circuit area defined in a corresponding pixel SP and may be connected to a gate line GL, a data line DL, and a driving power line PL which are adjacent thereto. Each pixel circuit PC may control a current flowing in the light emitting device 300 according to a data signal supplied through the data line DL in response to a scan pulse supplied through the gate line GL, based on the pixel driving power supplied through the driving power line PL. The pixel circuit PC according to an embodiment may include a switching TFT T1, a driving TFT T2, and a capacitor Cst.

For each pixel SP, switching TFT T1 may include a gate electrode connected to the gate line GL, a first electrode connected to the data line DL, and a second electrode connected to a gate electrode N1 of the driving TFT T2. In this instance, each of the first and second electrodes of the switching TFT T1 may be a source electrode or a drain electrode according to a direction of a current. The switching TFT T1 may be turned on according to the scan pulse supplied through the gate line GL and may supply the data signal, supplied through the data line DL, to the driving TFT T2.

The driving TFT T2 may be turned on by a voltage supplied through the switching TFT T1 and/or a voltage of the capacitor Cst to control the amount of current flowing from the driving power line PL to the light emitting device 300. To this end, the driving TFT T2 according to an embodiment may include a gate electrode connected to the second electrode N1 of the switching TFT T1, a drain electrode connected to the driving power line PL, and a source electrode connected to the light emitting device 300.

The driving TFT T2 may control a data current flowing from the driving power line PL to the light emitting device 300 according to the data signal supplied through the switching TFT T1, thereby allowing the light emitting device 300 to emit light having brightness proportional to the data signal.

The capacitor Cst may be provided in an overlap area between the gate electrode N1 and the source electrode of the driving TFT T2, may store a voltage corresponding to the data signal supplied to the gate electrode of the driving TFT T2, and may turn on the driving TFT T2 with the stored voltage.

Each of the plurality of concave portions 130 may be provided in an emissive area defined in each of the plurality of pixels SP and may accommodate the light emitting device 300. Each of the plurality of concave portions 130 according to an embodiment may be provided concavely from a first planarization layer (or a passivation layer) 110 (e.g., see FIG. 3) provided on the first substrate 100 to cover the pixel SP, namely, the pixel circuit PC. For example, each of the plurality of concave portions 130 may have a groove shape or a cup shape having a certain depth from a top 110a (e.g., see FIG. 3) of the first planarization layer 110. Each of the plurality of concave portions 130 may be concavely provided in the first planarization layer 110 and may accommodate the light emitting device 300, thereby minimizing an increase in a thickness of a display device caused by a thickness (or a depth) of the light emitting device 300.

Each of the plurality of light emitting devices 300 may be accommodated into the concave portion 130 provided in a corresponding pixel SP of the plurality of pixels SP. Each of the plurality of light emitting devices 300 may be connected to the pixel circuit PC of a corresponding pixel SP, and thus, may emit light having brightness proportional to a current flowing from the pixel circuit PC (i.e., the driving TFT T2) to the common power line CL. Each of the light emitting devices 300 according to an embodiment may be a light emitting diode device or a light emitting diode chip which emits one of red light, green light, blue light, and white light. For example, the light emitting device 300 may be a micro light emitting diode device or a micro light emitting diode chip. In this instance, the micro light emitting diode chip may have a scale of 1 μm to 100 μm, but is not limited thereto. In other embodiments, the micro light emitting diode chip may have a size which is smaller than a size of an emissive area other than an area occupied by the pixel circuit PC in a corresponding pixel area.

The plurality of light emitting devices 300 according to an embodiment may each include a first electrode E1 (e.g., see FIG. 3) connected to the source electrode of the driving TFT T2 through a first circuit contact hole CCH1, a second electrode E2 (e.g., see FIG. 3) connected to the common power line CL through a second circuit contact hole CCH2, and a light emitting layer provided between the first electrode E1 and the second electrode E2. Each of the plurality of light emitting devices 300 may be accommodated into the concave portion 130 and may be exposed in a direction toward an upper portion of the concave portion 130 without being covered by the concave portion 130. That is, each of the plurality of light emitting devices 300 may include a first portion where the first and second electrodes E1 and E2 are provided and a second portion opposite to the first portion, and may be accommodated into the concave portion 130 so that the first portion is disposed relatively farther apart from a floor surface 130a (e.g., see FIG. 3) of the concave portion 130 than the second portion and is adjacent to an image display surface. For example, when it is assumed that the first portion of the light emitting device 300 is an upper portion of the light emitting device 300 and the second portion of the light emitting device 300 is a lower portion of the light emitting device 300, in the present embodiment, the light emitting device 300 may be accommodate into the concave portion 130 without a top and a bottom of the light emitting device 300 being reversed therebetween, and thus, a process of reversing the top and the bottom of the light emitting device 300 may be omitted in comparison with the related art. In embodiments of the present disclosure, a distance between the first portion to the floor surface 116a of the concave portion 116 may be greater than a distance between the second portion to the floor surface 116a of the concave portion 116. A structure of each of the light emitting devices 300 will be described below.

The second substrate 500 may be disposed to cover the first substrate 100 and may be defined as an opposite substrate, a color filter array substrate, or an encapsulation substrate. The second substrate 500 may be opposite-bonded to the first substrate 100 by a sealant surrounding the display area AA of the first substrate 100.

In addition, the light emitting diode display device according to an embodiment of the present disclosure may further include a scan driving circuit 700 and a panel driver 900.

The scan driving circuit 700 may generate the scan pulse according to a gate control signal input from the panel driver 900 and may supply the scan pulse to the gate lines GL. The scan driving circuit 700 may be built into the third non-display area of the first substrate 100 through a process which is the same as a process of forming the TFTs provided in each pixel SP. For example, the scan driving circuit 700 may be provided in a left and/or right non-display area with respect to the display area AA, but is not limited thereto. In other embodiments, the scan driving circuit 700 may be provided in an arbitrary non-display area which enables the scan pulse to be supplied to the gate lines GL.

Optionally, the scan driving circuit 700 may be manufactured as a driving integrated circuit (IC) type. In this instance, the scan driving circuit 700 according to an embodiment may be mounted in the third and/or fourth non-display area of the first substrate 100 so as to be connected to the plurality of gate lines in a one-to-one correspondence relationship. According to another embodiment, the scan driving circuit 700 may be mounted on a gate flexible circuit film, and in this instance, the gate flexible circuit film may be attached on a gate pad part provided in the third and/or fourth non-display area of the first substrate 100, whereby the scan driving circuit 700 may be connected to the plurality of gate lines GL through the gate flexible circuit film and the gate pad part in a one-to-one correspondence relationship.

The panel driver 900 may be connected to a pad part provided in the first non-display area of the first substrate 100 and may display an image, corresponding to image data supplied from a display driving system, on the display area AA. The panel driver 900 according to an embodiment may include a plurality of data flexible circuit films 910, a plurality of data driving ICs 930, a printed circuit board (PCB) 950, a timing controller 970, and a power circuit 990.

Each of the plurality of data flexible circuit films 910 may be attached on the pad part of the first substrate 100 through a film attachment process.

Each of the plurality of data driving ICs 930 may be individually mounted on a corresponding data flexible circuit film of the plurality of data flexible circuit films 910. The data driving ICs 930 may receive pixel data and a data control signal supplied from the timing controller 970, convert the pixel data into analog data voltages by pixels according to the data control signal, and respectively supply the analog data voltages to the data lines DL.

The PCB 950 may be connected to the plurality of data flexible circuit films 910. The PCB 950 may support the timing controller 970 and the power circuit 990 and may transfer signals and power between the elements of the panel driver 900.

The timing controller 970 may be mounted on the PCB 950 and may receive image data and a timing synchronization signal supplied from the display driving system through a user connector provided on the PCB 950. The timing controller 970 may align the image data according to a pixel arrangement structure of the display area AA based on the timing synchronization signal to generate pixel data and may supply the generated pixel data to the data driving ICs 930. Also, the timing controller 970 may generate the data control signal and the gate control signal, based on the timing synchronization signal and may control a driving timing of each of the data driving ICs 930 and the scan driving circuit 700.

The power circuit 990 may be mounted on the PCB 950 and may generate various voltages necessary for displaying an image on the display area AA by using an input power received from the outside to supply each of the voltages to a corresponding element.

In addition, the panel driver 900 may further include a control board connected to the PCB 950. In this instance, the timing controller 970 and the power circuit 990 may be mounted on the control board without being mounted on the PCB 950. Accordingly, the PCB 950 may perform only a function of transferring signals and power between the plurality of data flexible circuit films 910 and the control board.

In the light emitting diode display device according to an embodiment of the present disclosure, since each of the light emitting devices 300 is accommodated into the concave portion 130 provided in the emissive area of a corresponding pixel SP, a misalignment of the light emitting devices 300 mounted on the pixels SP is prevented or reduced from occurring in a mounting process performed for the light emitting devices 300, and an alignment precision of the light emitting devices 300 is improved. Particularly, in the light emitting diode display device according to an embodiment of the present disclosure, since the electrodes of each of the light emitting devices 300 are greatly spaced apart from the floor surface 130a of the concave portion 130 and are connected to the pixel circuit PC through the contract holes CCH1 and CCH2, a connection process of connecting the light emitting device 300 and the pixel circuit PC is simplified, and a process time taken in connecting the light emitting device 300 and the pixel circuit PC is shortened.

Figure 3:
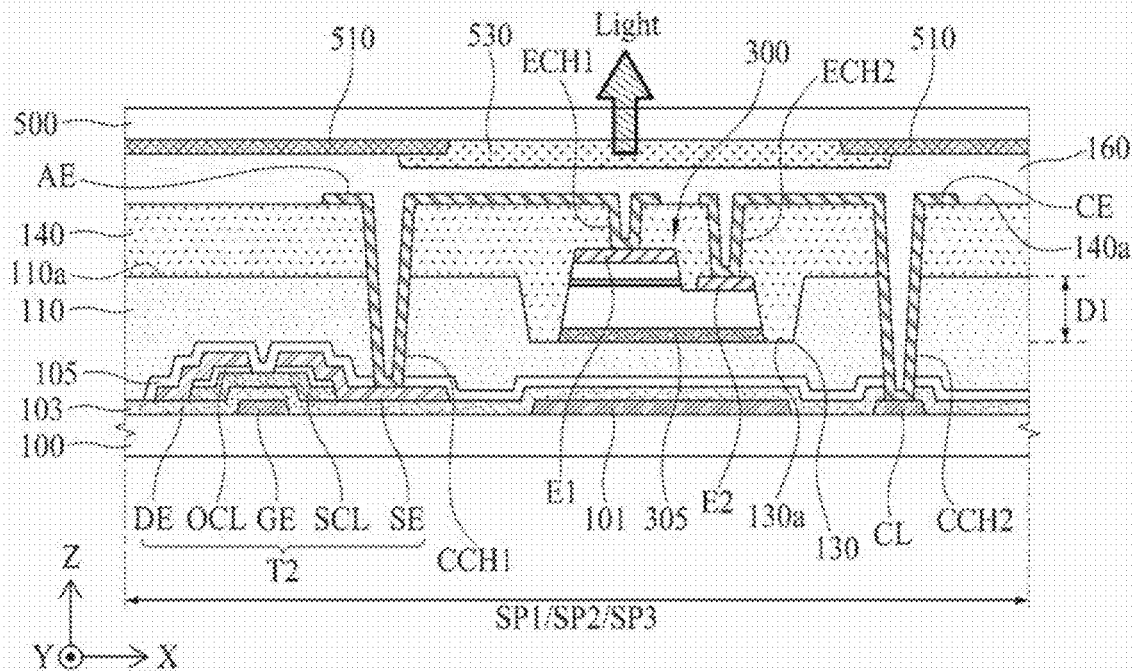
FIG. 3 is a cross-sectional view for describing a connection structure of a driving TFT and a light emitting device in one pixel illustrated in FIG. 2.
Figure 4:
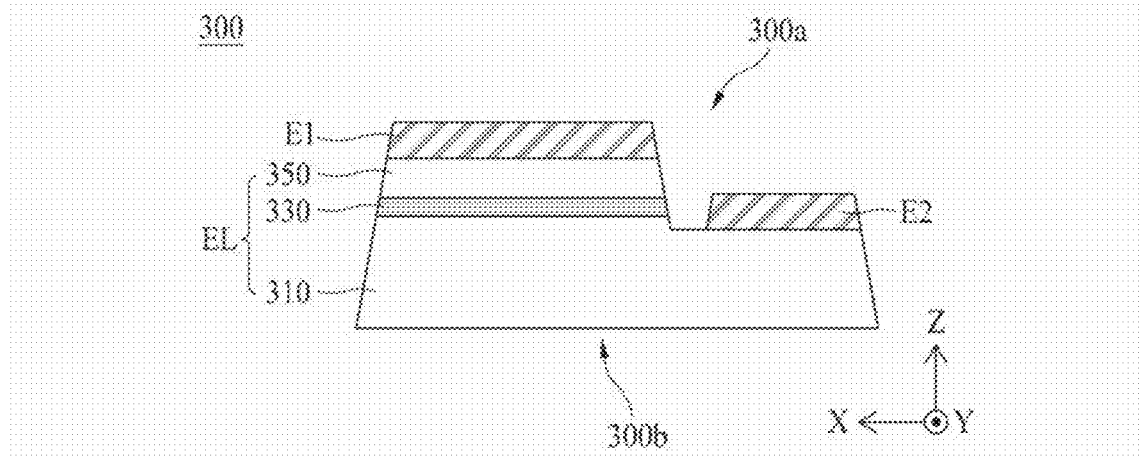
FIG. 4 is a cross-sectional view for describing the light emitting device illustrated in FIG. 3.

FIG. 3 is a cross-sectional view for describing a connection structure of a driving TFT and a light emitting device in one pixel illustrated in FIG. 2, and FIG. 4 is a cross-sectional view for describing the light emitting device illustrated in FIG. 3.

Referring to FIGS. 3 and 4 along with FIG. 2, a light emitting diode display device according to the present embodiment may include a plurality of pixels SP, a first planarization layer 110, a concave portion 130, a light emitting device 300, a second planarization layer 140, a pixel electrode AE, and a common electrode CE.

The plurality of pixels SP may each include a pixel circuit PC including a driving TFT T2 provided on a first substrate 100.

The driving TFT T2 may include a gate electrode GE, a semiconductor layer SCL, an ohmic contact layer OCL, a source electrode SE, and a drain electrode DE.

The gate electrode GE may be formed on the first substrate 100 along with the gate lines GL. The gate electrode GE may be covered by a gate insulation layer 103.

The gate insulation layer 103 may be formed of a single layer or a multilayer including an inorganic material and may be formed of silicon oxide (SiOx) silicon nitride (SiNx), and/or the like.

The semiconductor layer SCL may be provided in a predetermined pattern (or island) type on the gate insulation layer 103 to overlap the gate electrode GE. The semiconductor layer SCL may be formed of a semiconductor material including one of amorphous silicon, polycrystalline silicon, oxide, and an organic material, but is not limited thereto.

The ohmic contact layer OCL may be provided in a predetermined pattern (or island) type on the semiconductor layer SCL. In this instance, the ohmic contact layer OCL is for an ohmic contact between the semiconductor layer SCL and the source and drain electrodes SE and DE and may be omitted.

The source electrode SE may be formed on one side of the ohmic contact layer OCL to overlap one side of the semiconductor layer SCL. The source electrode SE may be formed along with the data lines DL and the driving power lines PL.

The drain electrode DE may be formed on the other side of the ohmic contact layer OCL to overlap the other side of the semiconductor layer SCL and may be spaced apart from the source electrode SE. The drain electrode DE may be formed along with the source electrode SE and may branch or protrude from an adjacent driving power line PL.

In addition, the switching TFT T1 configuring the pixel circuit PC may be formed in a structure which is the same as that of the driving TFT T2. In this instance, the gate electrode of the switching TFT T1 may branch or protrude from the gate line GL, the first electrode of the switching TFT T1 may branch or protrude from the data line DL, and the second electrode of the switching TFT T1 may be connected to the gate electrode GE of the driving TFT T2 through a via hole provided in the gate insulation layer 103.

The pixel circuit PC may be covered by an interlayer insulation layer 105. The interlayer insulation layer 105 may be provided all over the first substrate 100 to cover the pixel circuit PC including the driving TFT T2. The interlayer insulation layer 105 according to an embodiment may be formed of an inorganic material, such as SiOx or SiNx, or an organic material such as benzocyclobutene or photo acryl. The interlayer insulation layer 105 may not be provided.

The first planarization layer (or the passivation layer) 110 may be provided all over the first substrate 100 to cover the pixel SP (i.e., the pixel circuit PC), or may be provided all over the first substrate 100 to cover the interlayer insulation layer 105. The first planarization layer 110 may protect the pixel circuit PC including the driving TFT T2 and may provide a planar surface on the interlayer insulation layer 105. The first planarization layer 110 according to an embodiment may be formed of an organic material such as benzocyclobutene or photo acryl, and particularly, may be formed of photo acryl for convenience of a process.

Each concave portion 130 may be provided in an emissive area defined in the corresponding pixel SP and may accommodate the corresponding light emitting device 300. In this instance, the emissive area of the pixel SP may be defined as an area including an area overlapping the light emitting device 300, and more particularly, may be defined as an area other than a circuit area with the pixel circuit PC provided therein in a pixel area.

The concave portion 130 according to an embodiment may be provided concavely from the first planarization layer 110, which is provided on the first substrate 100 to cover the pixel circuit PC, to have a certain depth D1. In this instance, the concave portion 130 may be provided concavely from the top 110a of the first planarization layer 110 to have a depth corresponding to a thickness (or a total height) of the light emitting device 300. In this instance, the floor surface 130a of the concave portion 130 may be formed by removing a portion of the first planarization layer 110, a whole portion of the first planarization layer 110, the whole portion of the first planarization layer 110 and a portion of the interlayer insulation layer 105, or the whole portion of the first planarization layer 110 and the interlayer insulation layer 105, and a whole portion of the gate insulation layer 103 which overlap the emissive area of the pixel SP, in order to have the depth D1 which is set based on the thickness of the light emitting device 300. For example, the concave portion 130 may be provided to have a depth of 2 μm to 6 μm from the top 110a of the first planarization layer 110. The concave portion 130 may have a groove or cup shape having a size of the floor surface 130a which is wider than a second portion 300b of the light emitting device 300.

The light emitting device 300 according to an embodiment may be accommodated into the concave portion 130 provided in the pixel SP and may be connected to the pixel circuit PC. The light emitting device 300 may include a first portion 300a, including the first and second electrodes E1 and E2 connected to the pixel circuit PC, and a second portion 300b opposite to the first portion 300a. In this instance, the first portion 300a of the light emitting device 300 may be disposed relatively farther away from the floor surface 130a of the concave portion 130 than the second portion 300b. That is, in the light emitting device 300, the first and second electrodes E1 and E2 provided in the first portion 300a may be disposed to face the second substrate 500 without being disposed to face the inside of the concave portion 130, namely, the floor surface 130a of the concave portion 130. In this instance, the first portion 300a of the light emitting device 300 may have a size which is smaller than the second portion 300b, and in this instance, the light emitting device 300 may have a cross-sectional surface having a trapezoid shape. The first and second electrodes E1 and E2 of the light emitting device 130 may have differences in height relative to the floor surface 116a of the concave portion 116. In embodiments of the present disclosure, a height of the light emitting device 130 may be greater than a depth of the concave portion 116, but in other embodiments, the height of the light emitting device 130 may be less than the depth of the concave portion 116. Also, heights of the first electrode E1 and the second electrode E2 may be the same, and the pixel electrode pattern AE and the common electrode pattern CE may be co-planar.

The light emitting device 300 according to an embodiment may include a light emitting layer EL, the first electrode E1, and the second electrode E2.

The light emitting layer EL may emit light according to a recombination of an electron and a hole based on a current flowing between the first electrode E1 and the second electrode E2. The light emitting layer EL according to an embodiment may include a first semiconductor layer 310, an active layer 330, and a second semiconductor layer 350.

The first semiconductor layer 310 may supply an electron to the active layer 330. The first semiconductor layer 310 according to an embodiment may be formed of an n-GaN-based semiconductor material, and examples of the n-GaN-based semiconductor material may include GaN, AlGaN. InGaN, AlInGaN, etc. In this instance, silicon (Si), germanium (Ge), selenium (Se), tellurium (Te), or carbon (C) may be used as impurities used for doping of the first semiconductor layer 310.

The active layer 330 may be provided on one side of the first semiconductor layer 310. The active layer 330 may have a multi quantum well (MQW) structure which includes a well layer and a barrier layer which is higher in band gap than the well layer. The active layer 330 according to an embodiment may have an MQW structure of InGaN/GaN or the like.

The second semiconductor layer 350 may be provided on the active layer 330 and may supply a hole to the active layer 330. The second semiconductor layer 350 according to an embodiment may be formed of a p-GaN-based semiconductor material, and examples of the p-GaN-based semiconductor material may include GaN, AlGaN. InGaN, AlInGaN, etc. In this instance, magnesium (Mg), zinc (Zn), or beryllium (Be) may be used as impurities used for doping of the second semiconductor layer 350.

In addition, the first semiconductor layer 310, the active layer 330, and the second semiconductor layer 350 may be provided in a structure of being sequentially stacked on a semiconductor substrate. In this instance, the semiconductor substrate may include a semiconductor material included in a sapphire substrate or a silicon substrate. The semiconductor substrate may be used as a growth semiconductor substrate for growing each of the first semiconductor layer 310, the active layer 330, and the second semiconductor layer 350, and then, may be separated from the first semiconductor layer 310 through a substrate separation process. In this instance, the substrate separation process may be a laser lift-off process or a chemical lift-off process. Therefore, since the growth semiconductor substrate is removed from the light emitting device 300, the light emitting device 300 has a thin thickness, and thus, may be accommodated into the concave portion 130 provided in the pixel SP.

The first electrode E1 may be provided on the second semiconductor layer 350. The first electrode E1 may be connected to the source electrode SE of the driving TFT T2.

The second electrode E2 may be provided on the other side of the first semiconductor layer 310 and may be electrically disconnected from the active layer 330 and the second semiconductor layer 350. The second electrode E2 may be connected to the common power line CL.

Each of the first and second electrodes E1 and E2 according to an embodiment may be formed of a material including one or more materials of a metal material, such as gold (Au), tungsten (W), platinum (Pt), iridium (Ir), silver (Ag), copper (Cu), nickel (Ni), titanium (Ti), or chromium (Cr), and an alloy thereof. In other embodiments, each of the first and second electrodes E1 and E2 may be formed of a transparent conductive material, and examples of the transparent conductive material may include indium tin oxide (ITO), indium zinc oxide (IZO), etc. However, the present embodiment is not limited thereto.

The light emitting device 300 may emit the light according to the recombination of the electron and the hole based on the current flowing between the first electrode E1 and the second electrode E2. In this instance, the light emitted from the light emitting device 300 may pass through the first and second electrodes E1 and E2 and may be output to the outside, thereby displaying an image. In other words, the light emitted from the light emitting device 300 may pass through the first and second electrodes E1 and E2 and may be output in a second direction opposite to a first direction toward the floor surface 130a of the concave portion 130, thereby displaying an image.

The light emitting device 300 may be adhered to the floor surface 130a of the concave portion 130 by an adhesive member 305.

The adhesive member 305 may be disposed between the floor surface 130a of the concave portion 130 and the light emitting device 300 and may attach the light emitting device 300 on the floor surface 130a of the concave portion 130. For example, the adhesive member 305 may be attached (coated) on the second portion 300b of the light emitting device 300 (i.e., a back surface of the first semiconductor layer 310), and thus, in a mounting process of mounting the light emitting device 300 onto the concave portion 130, the adhesive member 305 may be adhered to the floor surface 130a of the concave portion 130. As another example, the adhesive member 305 may be dotted onto the floor surface 130a of the concave portion 130 and may be spread by pressure which is applied thereto in a mounting process performed for the light emitting device 300, and thus, may be adhered to the second portion 300b of the light emitting device 300 (i.e., the back surface of the first semiconductor layer 310). Therefore, the light emitting device 300 mounted on the concave portion 130 may be primarily position-fixed by the adhesive member 305. Accordingly, according to an embodiment of the present disclosure, the mounting process for the light emitting device 300 may be performed in a method of simply attaching the light emitting device 300 on the floor surface 130a of the concave portion 130, and thus, a mounting process time taken in performing the mounting process for the light emitting device 300 is shortened.

A mounting process for a light emitting device according to an embodiment may further include a process of mounting a red light emitting device on each of red pixels SP1, a process of mounting a green light emitting device on each of green pixels SP2, and a process of mounting a blue light emitting device on each of blue pixels SP3, and moreover, may further include a process of mounting a white light emitting device on each of white pixels.

The mounting process for the light emitting device according to an embodiment may include only a process of mounting the white light emitting device on each of pixels. In this instance, the first substrate 100 or the second substrate 500 may include a color filter layer overlapping each pixel. The color filter layer may transmit only light, having a wavelength of a color corresponding to a corresponding pixel, of white light.

The mounting process for the light emitting device according to an embodiment may include only a process of mounting a first-color light emitting device on each pixel. In this instance, the first substrate 100 or the second substrate 500 may include a wavelength conversion layer and the color filter layer overlapping each pixel. The wavelength conversion layer may emit light of a second color, based on some of light incident from the first-color light emitting device. The color filter layer may transmit only light, having a wavelength of a color corresponding to a corresponding pixel, of white light based on a combination of light of the first color and the light of the second color. In this instance, the first color may be blue, and the second color may be yellow.

The second planarization layer 140 may be provided on the first planarization layer 110 to cover the light emitting device 130. The second planarization layer 140 may be provided all over the first substrate 100 to cover a top 110a of the first planarization layer 110, a peripheral portion of the light emitting device 300 disposed in the concave portion 130, and a top of the light emitting device 300. In this instance, the second planarization layer 140 may be provided to have a thickness which enables the second planarization layer 140 to bury a peripheral space of the light emitting device 300 disposed in the concave portion 130 and cover the first and second electrodes E1 and E2 of the light emitting device 300 disposed in the concave portion 130. The second planarization layer 140 may provide a planarization surface of the first planarization layer 110. Also, the second planarization layer 140 may bury the peripheral space of the light emitting device 300 disposed in the concave portion 130 to secondarily fix the light emitting device 300 which is primarily fixed to the concave portion 130 by the adhesive member 305. In embodiments of the present disclosure, a portion of the second planarization layer 140 may be disposed between the first electrode E1 and the second electrode E2.

The pixel electrode AE may be electrically connected to the driving TFT T2 and the first electrode E1 of the light emitting device 300 and may be defined as an anode electrode. The pixel electrode AE may be provided on the second planarization layer 140 overlapping the driving TFT T2 and the first electrode E1 of the light emitting device 300. The pixel electrode AE may be electrically connected to the source electrode SE of the driving TFT T2 through a first circuit contact hole CCH1 which is provided to pass through the interlayer insulation layer 105, the first planarization layer 110, and the second planarization layer 140, and may be electrically connected to the first electrode E1 of the light emitting device 300 through a first electrode contact hole ECH1 provided in the second planarization layer 140. Therefore, the first electrode E1 of the light emitting device 300 may be electrically connected to the source electrode SE of the driving TFT T2 through the pixel electrode AE. In this manner, if the light emitting diode display device has a top emission structure, the pixel electrode AE may be formed of a transparent conductive material, and if the light emitting diode display device has a bottom emission structure, the pixel electrode AE may be formed of a light reflection conductive material. In this instance, the transparent conductive material may be indium tin oxide (ITO), indium zinc oxide (IZO), or the like, but is not limited thereto. The light reflection conductive material may be Al, Ag, Au, Pt, Cu, or the like, but is not limited thereto. The pixel electrode AE including the light reflection conductive material may be formed of a single layer including the light reflection conductive material or a multilayer including a plurality of the single layers which are stacked.

The first circuit contact hole CCH1 may be provided in the first and second planarization layers 110 and 140 and the interlayer insulation layer 105 overlapping a portion of the source electrode SE of the driving TFT T2 and may expose the portion of the source electrode SE of the driving TFT T2. The first circuit contact hole CCH1 may be provided by removing the first and second planarization layers 110 and 140 and the interlayer insulation layer 105 overlapping the portion of the source electrode SE of the driving TFT T2 through a hole patterning process using a photolithography process and an etching process.

The first electrode contact hole ECH1 may expose a portion or a whole portion of the first electrode E1 of the light emitting device 300 and may be provided along with the first circuit contact hole CCH1. The first electrode contact hole ECH1 may be provided by removing the second planarization layer 140 overlapping the portion or the whole portion of the first electrode E1 of the light emitting device 300 through a hole patterning process using a photolithography process and an etching process. In this instance, the first circuit contact hole CCH1 and the first electrode contact hole ECH1 may have different depths. Accordingly, in the present embodiment, a mask pattern may be formed on the second planarization layer 140 through a photolithography process using a half tone mask, and the first circuit contact hole CCH1 and the first electrode contact hole ECH1 may be simultaneously formed through an etching process using the mask pattern.

The common electrode CE may be electrically connected to the second electrode E2 of the light emitting device 300 and the common power line CL and may be defined as a cathode electrode. The common electrode CE may be provided on the second planarization layer 140 overlapping the second electrode E2 of the light emitting device 300 and the common power line CL. In this instance, the common electrode CE may be formed of a material which is the same as that of the pixel electrode AE. The common electrode CE may be electrically connected to the common power line CL through a second circuit contact hole CCH2 which is provided to pass through the gate insulation layer 103, the interlayer insulation layer 105, the first planarization layer 110, and the second planarization layer 140, and may be electrically connected to the second electrode E2 of the light emitting device 300 through a second electrode contact hole ECH2 provided in the second planarization layer 140. Therefore, the second electrode E2 of the light emitting device 300 may be electrically connected to the common power line CL through the common electrode CE.

The second circuit contact hole CCH2 may be provided in the gate insulation layer 103, the interlayer insulation layer 105, the first planarization layer 110, and the second planarization layer 140 overlapping a portion of the common power line CL and may expose the portion of the common power line CL. The second circuit contact hole CCH2 may be provided by removing the gate insulation layer 103, the interlayer insulation layer 105, the first planarization layer 110, and the second planarization layer 140 overlapping the portion of the common power line CL through a hole patterning process using a photolithography process and an etching process. The second circuit contact hole CCH2 may be provided along with the first circuit contact hole CCH1 and the first electrode contact hole ECH1.

The second electrode contact hole ECH2 may expose a portion or a whole portion of the second electrode E2 of the light emitting device 300 and may be provided along with the second circuit contact hole CCH2. The second electrode contact hole ECH2 may be provided by removing the second planarization layer 140 overlapping the portion or the whole portion of the second electrode E2 of the light emitting device 300 through a hole patterning process using a photolithography process and an etching process. In this instance, the second circuit contact hole CCH2 and the second electrode contact hole ECH2 may be provided through the same hole patterning process as the first circuit contact hole CCH1 and the first electrode contact hole ECH1.

The pixel electrode AE and the common electrode CE may be simultaneously provided through an electrode patterning process using a deposition process of depositing an electrode material on the second planarization layer 140 including the first and second circuit contact holes CCH1 and CCH2 and the first and second electrode contact holes ECH1 and ECH2, a lithography process and an etching process. Therefore, in the present embodiment, since the common electrode CE and the pixel electrode AE connecting the light emitting device 300 and the pixel circuit PC are simultaneously formed, an electrode connection process is simplified, and a process time taken in a process of connecting the light emitting device 300 and the pixel circuit PC is considerably shortened, thereby enhancing a productivity of the light emitting diode display device.

The light emitting diode display device according to the present embodiment may further include a second substrate 500.

The second substrate 500 may be disposed to cover a portion other than the pad part of the first substrate 100, thereby protecting a pixel array provided on the first substrate 100. The second substrate 500 may be defined as a color filter array substrate, an opposite substrate, or an encapsulation substrate. For example, the second substrate 500 according to an embodiment may be formed of a transparent glass material, a transparent plastic material, and/or the like, but is not limited thereto.

The second substrate 500 according to an embodiment may include a black matrix 510.

The black matrix 510 may define an opening area of each pixel SP provided on the first substrate 100. That is, the black matrix 510 may be provided on the second substrate 500 overlapping a light blocking area other than the opening area overlapping the light emitting device 300 of each pixel SP, thereby preventing or reducing color mixture between adjacent opening areas. The black matrix 510 according to an embodiment may include a plurality of first light blocking patterns which cover the plurality of gate lines GL, the plurality of common power lines CL, and the pixel circuit PC of each pixel SP, a plurality of second light blocking patterns which cover the plurality of data lines DL and the plurality of driving power lines PL, and a third light blocking pattern Which covers an edge of the second substrate 500. In this instance, the first to third light blocking patterns may be provided on the same layer, and thus, the black matrix 510 may have a mesh form.

In addition, the second substrate 500 may further include a light extraction layer 530 provided in the opening area defined by the black matrix 510. The light extraction layer 530 may be formed of a transparent material and may externally extract light emitted from the light emitting device 300. An opposite surface of the light extraction layer 530 facing the light emitting device 300 may have a lens form for increasing a linearity of the light emitted from the light emitting device 300. The light extraction layer 530 minimizes a step height between the opening area and a top of the black matrix 510 provided on the second substrate 500.

In an instance where the light emitting device 300 disposed in each pixel SP emits white light, the second substrate 500 may include a color filter layer 530 provided in the opening area, instead of the light extraction layer 530.

The color filter layer 530 may include a red color filter, a green color filter, and a blue color filter corresponding to respective colors defined in the plurality of pixels SP. The color filter layer 530 may transmit only light, having a wavelength of a color corresponding to a corresponding pixel SP, of the white light emitted from the corresponding pixel SP.

The light emitting diode display device according to an embodiment of the present disclosure may further include an encapsulation layer 160 that covers a top of the first substrate 100 including the pixel SP and the light emitting device 300.

The encapsulation layer 160 may be provided between the first substrate 100 and the second substrate 500 to cover the pixel SP and the light emitting device 300. That is, the encapsulation layer 160 may be coated on the top of the first substrate 100 including the pixel SP and the light emitting device 300, thereby protecting the pixel SP and the light emitting device 300 provided on the first substrate 100. The encapsulation layer 160 may be an optical clear adhesive (OCA) or an optical clear resin (OCR), but is not limited thereto.

The encapsulation layer 160 according to an embodiment may be formed of a thermocurable resin and/or a photocurable resin. The encapsulation layer 160 may be directly coated on the top of the first substrate 100 in a liquid state, and then, may be cured by a curing process using heat and/or light. In this instance, a curing process for the encapsulation layer 160 may be performed after a process of bonding the second substrate 500 to the encapsulation layer 160 coated on the top of the first substrate 100. The encapsulation layer 160 may buffer the press of the second substrate 500 in the process of bonding the second substrate 500 to the first substrate 100.

The light emitting diode display device according to an embodiment of the present disclosure may further include a reflective layer 101 disposed between the first substrate 100 and the light emitting device 300.

The reflective layer 101 may be disposed between the floor surface 130a of the concave portion 130 and the first substrate 100 to overlap the light emitting device 300. The reflective layer 101 according to an embodiment may be formed of a material which is the same as that of the gate electrode GE of the driving TFT T2, and may be provided on the same layer as the gate electrode GE. The reflective layer 101 may reflect light, which is incident from the light emitting device 300, toward the second substrate 500. Accordingly, the light emitting diode display device according to an embodiment of the present disclosure may include the reflective layer 101, and thus, may have a top emission structure.

Optionally, the reflective layer 101 may be formed of a material which is the same as that of the source/drain electrode SE/DE of the driving TFT T2, and may be provided on the same layer as the source/drain electrode SE/DE.

Figure 5:
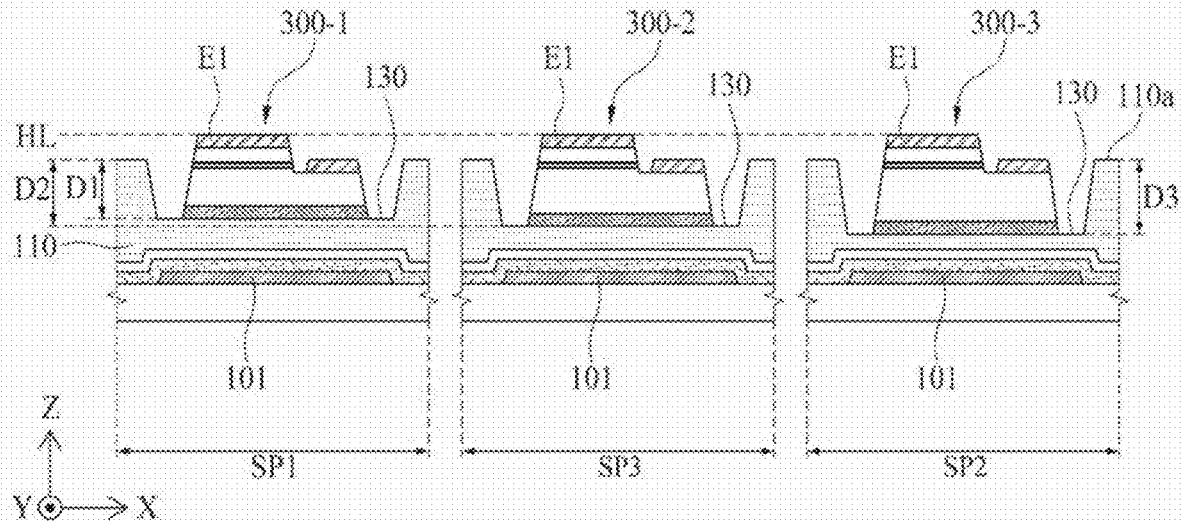
FIG. 5 is a diagram for describing a modification embodiment of a concave portion illustrated in FIG. 3.

FIG. 5 is a diagram for describing a modification embodiment of a concave portion illustrated in FIG. 3.

Referring to FIG. 5, a concave portion 130 according to the modification embodiment may be provided in plurality, and the plurality of concave portions 130 may be respectively provided to have different depths D1 to D3 in at least three adjacent pixels SP1 to SP3 configuring one unit pixel UP. That is, the concave portions 130 according to the modification embodiment may be provided to the different depths D1 to D3 from the top 110a of the first planarization layer 110, based on a height of the light emitting device 300 disposed in a corresponding pixel, and thus, a height deviation (or a step height) between a red light emitting device 300-1, a green light emitting device 300-2, and a blue light emitting device 300-3 is removed or minimized.

A light emitting diode display device according to the present embodiment may include a red pixel SP1, a green pixel SP3, and a blue pixel SP2 for realizing a color image, and the light emitting device 300 may be categorized into the red light emitting device 300-1, the green light emitting device 300-2, and the blue light emitting device 300-3 and may be disposed in the concave portion 130 provided in a pixel of a corresponding color. In this instance, the red light emitting device 300-1, the green light emitting device 300-2, and the blue light emitting device 300-3 may have different heights (or thicknesses) due to a process error in a manufacturing process. For example, a thickness of the light emitting device 300 may be thickened in the order of the red light emitting device 300-1, the green light emitting device 300-2, and the blue light emitting device 300-3. In this instance, the depths D1 to D3 of the concave portions 130 according to the modification embodiment may be progressively-deeply provided in the order of the red light emitting device 300-1, the green light emitting device 300-2, and the blue light emitting device 300-3, based on a height of a corresponding light emitting device.

Therefore, in the present embodiment, since the concave portions 130 of respective pixels are provided to the different depths D1 to D3 based on a height of the light emitting device 300 which is to be provided in a corresponding pixel, uppermost surfaces (for example, first electrodes E1) of the respective light emitting devices 300-1 to 300-3 disposed in pixels may be disposed on the same horizontal line HL, and thus, an open defect where the first electrode E1 of each of the light emitting devices 300-1 to 300-3 is not exposed is prevented from occurring due to a height deviation of each of the light emitting devices 300-1 to 300-3 in a patterning process performed for the first and second electrode contact holes. Also, according to the present embodiment, in the top emission structure, an optical distance between the reflective layer 101 and the light emitting devices 300-1 to 300-3 disposed in respective pixels is optimized by using the concave portions 130 which are provided to the different depths D1 to D3 in the respective pixels, and thus, a reflection efficiency of the reflective layer 101 is improved, thereby maximizing a light efficiency of each of the light emitting devices 300-1 to 300-3.

Figure 6:
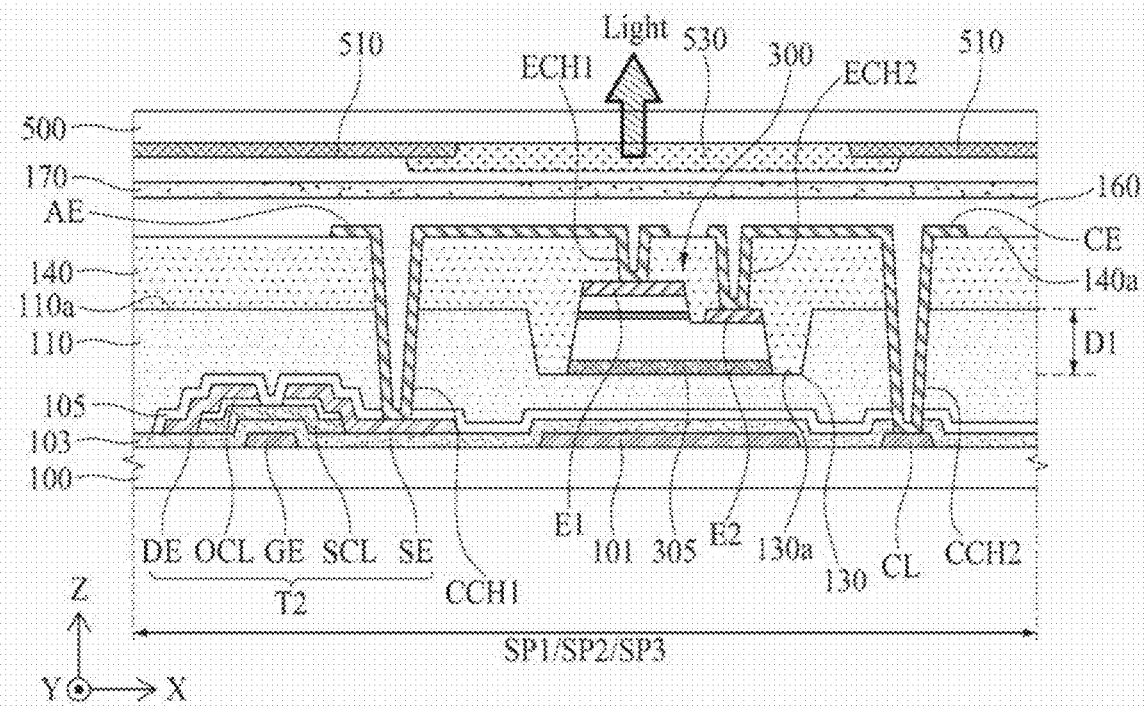
FIG. 6 is a diagram for describing a light emitting diode display device according to another embodiment of the present disclosure.

FIG. 6 is a diagram for describing a light emitting diode display device according to another embodiment of the present disclosure and is configured by adding a wavelength conversion layer to the light emitting diode display device illustrated in FIG. 3. Hereinafter, therefore, the wavelength conversion layer and elements associated thereto will be described.

Referring to FIG. 6, in the present embodiment, a wavelength conversion layer 170 may be provided between a first substrate 100 and a second substrate 500. If a light emitting device 300 emitting light of a first color except white is identically disposed in each of a plurality of pixels SP1 to SP3, the wavelength conversion layer 170 may be provided on a top of an encapsulation layer 160, for realizing a color through a unit pixel UP.

The wavelength conversion layer 170 may be provided on the top of the encapsulation layer 160 provided on the first substrate 100 and may be provided on the encapsulation layer 160 overlapping a display area of the first substrate 100. For example, the wavelength conversion layer 170 may be directly coated on a top of the first substrate 100 in a liquid state, and then, may be cured by a curing process using heat and/or light. As another example, the wavelength conversion layer 170 may be manufactured in a sheet form and may be directly adhered to the top of the encapsulation layer 160.

The wavelength conversion layer 170 may emit light of a second color, based on the light of the first color incident from the light emitting device 300 of each of the pixels SP1 to SP3. That is, the wavelength conversion layer 170 may absorb the light of the first color and may emit the light of the second color through re-emission. In this instance, the light of the first color may be blue light, and the light of the second color may be yellow light.

The wavelength conversion layer 170 according to an embodiment may include a phosphor or a quantum dot. The phosphor according to an embodiment may be a yellow phosphor which is excited by blue light to emit yellow light, and for example, may be an yttrium aluminum garnet (YAG)-based material. The quantum dot according to an embodiment may be excited by blue light to emit yellow light and may have a size for emitting light having a yellow wavelength, and for example, may include CdS, CdSe, CdTe, ZnS, ZnSe, GaAs, GaIP, GaAs—P, Ga—Sb, InAs, InP, InSb, AlAs, AlP, AlSb, and/or the like.

The light of the second color, which is re-emitted from the wavelength conversion layer 170 and is irradiated onto the second substrate 500, may be combined with the light of the first color which is irradiated onto the second substrate 500 without being re-emitted from the wavelength conversion layer 170, and thus, may be converted into white light. The white light may be filtered by a color filter layer 530 provided on the second substrate 500 to overlap each of the pixels SP1 to SP3, and thus, may be emitted as color light corresponding to each of the pixels SP1 to SP3.

Accordingly, in the present embodiment, since the same light emitting devices 300 are respectively disposed in the concave portions 130 of the plurality of pixels SP1 to SP3, a mounting process for light emitting devices may be performed irrespective of pixels, and thus, a mounting process time taken in the mounting process for light emitting devices is shortened.

Figure 7:
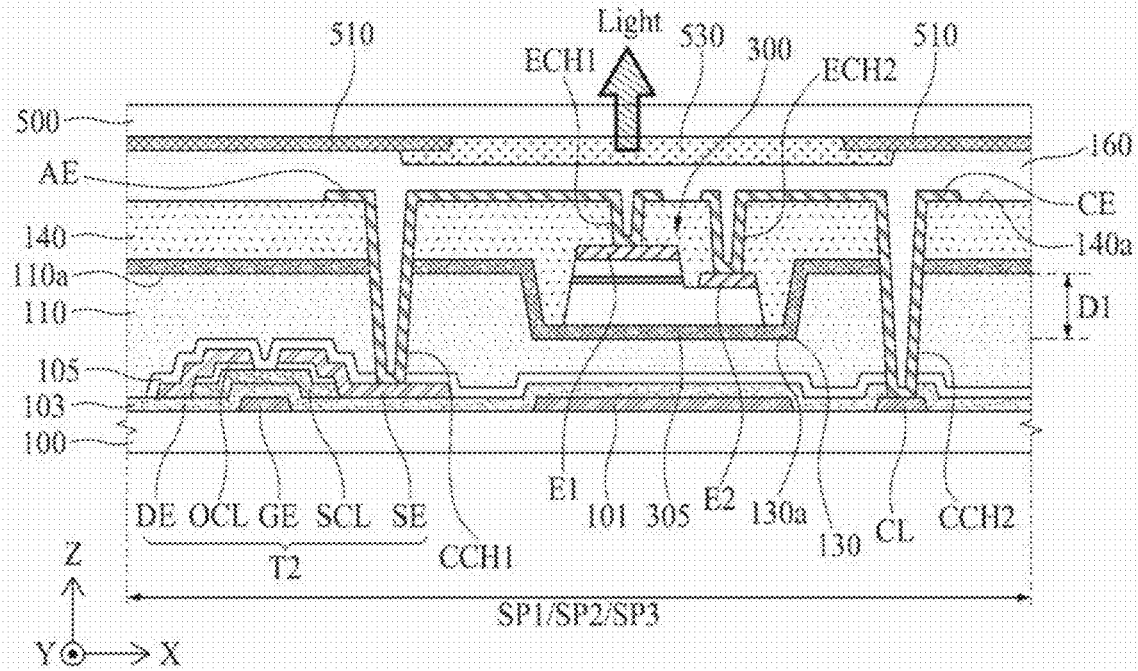
FIGS. 7 to 13 are diagrams for describing a light emitting diode display device according to another embodiment of the present disclosure.

FIG. 7 is a diagram for describing a light emitting diode display device according to another embodiment of the present disclosure and is configured by modifying the adhesive member of the light emitting diode display device illustrated in FIGS. 1 to 4. Hereinafter, therefore, the adhesive member and elements associated thereto will be described.

Referring to FIG. 7, in the present embodiment, an adhesive member 305 may be coated on a top 110a of a first planarization layer 110 and a side surface and a floor surface 130a of a concave portion 130. That is, the adhesive member 305 may be provided to wholly cover a portion of the first planarization layer 110 other than first and second circuit contact holes CCH1 and CCH2 provided in the first planarization layer 110. In other words, the adhesive member 305 may be disposed between the first planarization layer 110 and the second planarization layer 140 and may be disposed between the first planarization layer 110 and a light emitting device 300.

The adhesive member 305 according to an embodiment may be coated on the whole top 110a of the first planarization layer 110, where the concave portion 130 is provided, to a certain thickness. A portion of the adhesive member 305 coated on the top 110a of the first planarization layer 110, where the first and second circuit contact holes CCH1 and CCH2 are to be provided, may be removed when forming the first and second circuit contact holes CCH1 and CCH2. Therefore, in the present embodiment, immediately before a mounting process for the light emitting device 300, the adhesive member 305 may be coated on the whole top 110a of the first planarization layer 110, where the concave portion 130 is provided, to have a certain thickness, and thus, according to the present embodiment, a process time taken in forming the adhesive member 305 is shortened in comparison with the embodiment of FIGS. 1 to 4.

In the present embodiment, the adhesive member 305 may be provided on the whole top 110a of the first planarization layer 110, and thus, except that the second planarization layer 140 according to the present embodiment is provided to cover the adhesive member 305, the second planarization layer 140 according to the present embodiment is the same as the second planarization layer illustrated in FIG. 3.

Figure 8:
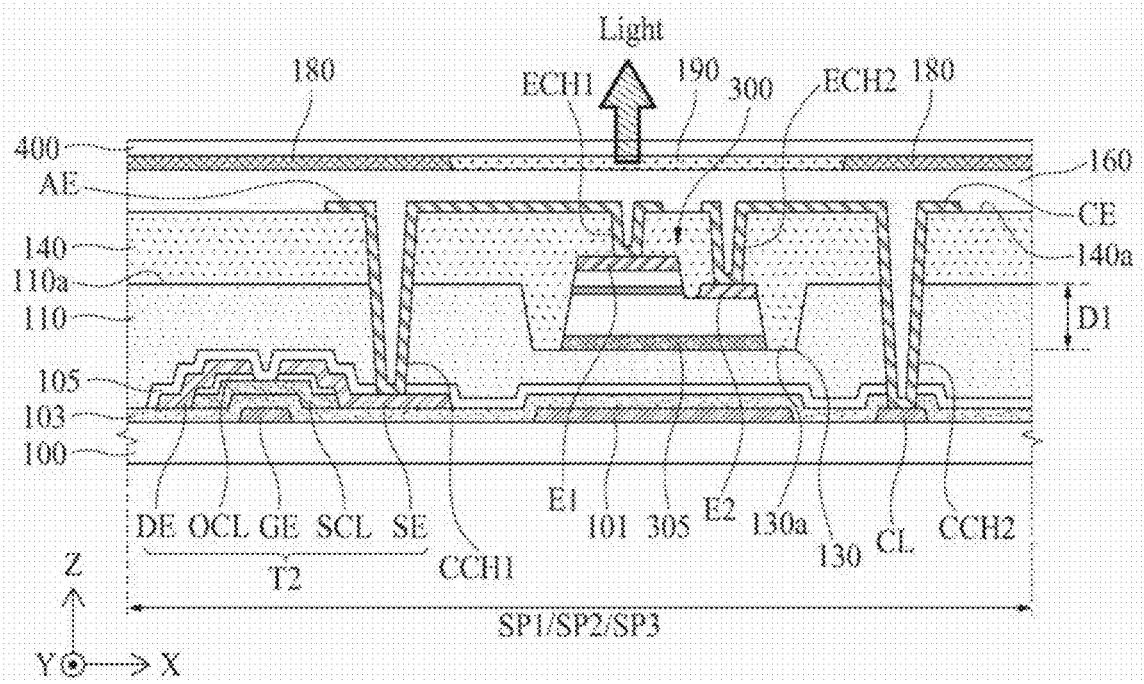

FIG. 8 is a diagram for describing a light emitting diode display device according to another embodiment of the present disclosure and is configured by removing the second substrate from the light emitting diode display device illustrated in FIG. 3. Hereinafter, therefore, elements associated to the removal of the second substrate will be described.

Referring to FIG. 8, the light emitting diode display device according to the present embodiment may include a cover layer 400 instead of the second substrate of the light emitting diode display device illustrated in FIG. 3.

The cover layer 400 may be formed to cover an encapsulation layer 160. The cover layer 400 protects each of a plurality of pixels SP and efficiently outputs light, emitted from a light emitting device 300 of each pixel SP, to the outside. The cover layer 400 according to an embodiment may be formed of a material having a relatively low refractive index. For example, the cover layer 400 may be formed of LiF, $MgF_2$, $CaF_2$, $ScF_3$, and/or the like and may have a multi-layer structure having different refractive indexes.

In addition, the light emitting diode display device according to the present embodiment may further include a black matrix 180 provided between an encapsulation layer 160 and the cover layer 400.

The black matrix 180 may define an opening area overlapping an emissive area of each pixel SP and may be provided on a top of the encapsulation layer 160 overlapping a light blocking area except the emissive area of each pixel SP, thereby preventing or reducing color mixture between adjacent pixels SP. Except that the black matrix 180 is directly provided on the top of the encapsulation layer 160, the black matrix 180 may have the same shape as that of the black matrix illustrated in FIG. 3 or 6, and thus, its repetitive description is not provided.

In an instance where the light emitting device 300 disposed in each pixel SP emits white light, the light emitting diode display device according to the present embodiment may further include a color filter layer 190.

The color filter layer 190 may be directly formed on a top of the encapsulation layer 160 overlapping the opening area defined by the black matrix 180 and may include a red color filter, a green color filter, and a blue color filter corresponding to respective colors defined in the plurality of pixels SP. The color filter layer 190 may transmit only light, having a wavelength of a color corresponding to a corresponding pixel SP, of the white light emitted from the corresponding pixel SP.

In addition, in the light emitting diode display device according to the present embodiment, an adhesive member 305 disposed only between a floor surface 130a of a concave portion 130 and the light emitting device 300 may be replaced with the adhesive member 305 illustrated in FIG. 7. That is, in the present embodiment, the adhesive member 305 may be disposed between a first planarization layer 110 and a second planarization layer 140 and may be disposed between the first planarization layer 110 and the light emitting device 300.

Figure 9:
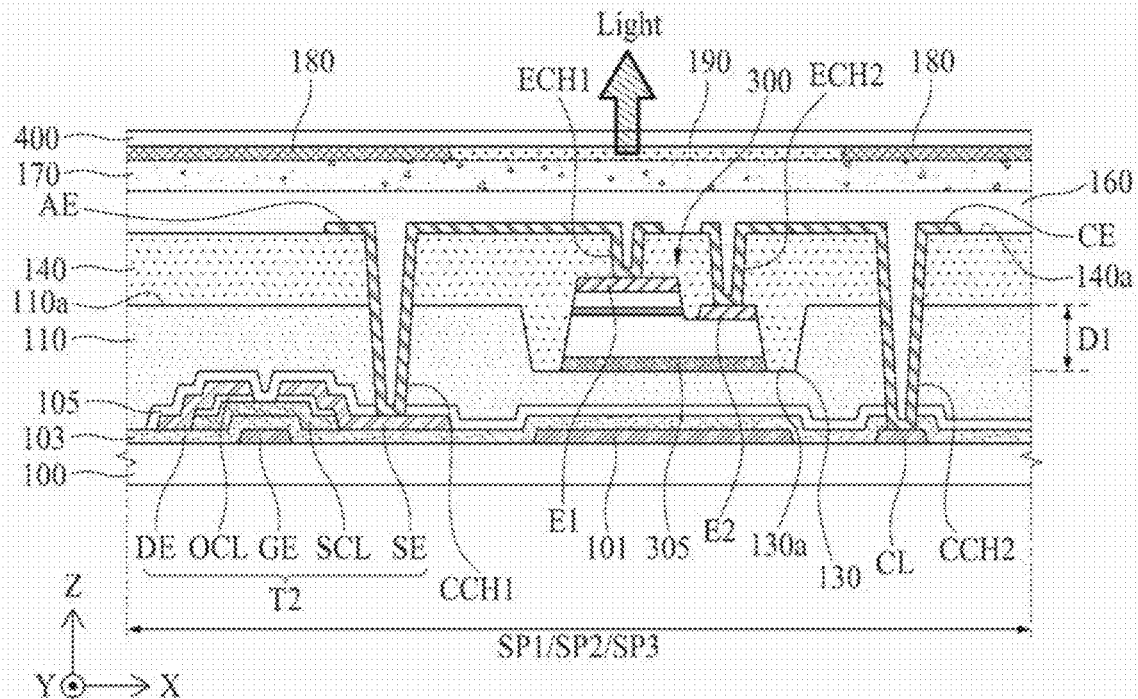

FIG. 9 is a diagram for describing a light emitting diode display device according to another embodiment of the present disclosure and is configured by adding a wavelength conversion layer to the light emitting diode display device illustrated in FIG. 8. Hereinafter, therefore, the wavelength conversion layer and elements associated thereto will be described.

Referring to FIG. 9, in the present embodiment, if a light emitting device 300 emitting light of a first color except white is identically disposed in each of a plurality of pixels SP1 to SP3, a wavelength conversion layer 170 may be provided on a top of an encapsulation layer 160, for realizing a color through a unit pixel UP. That is, the wavelength conversion layer 170 may be provided between the encapsulation layer 160 and each of a black matrix 180 and a color filter layer 190. The wavelength conversion layer 170 is the same as the wavelength conversion layer illustrated in FIG. 6, and thus, its repetitive description is not provided.

The black matrix 180 may be directly formed on the wavelength conversion layer 170 overlapping a light blocking area except an emissive area of each of a plurality of pixels SP.

The color filter layer 190 may be directly formed on a top of the wavelength conversion layer 170 overlapping an opening area defined by the black matrix 180 and may include a red color filter, a green color filter, and a blue color filter corresponding to respective colors defined in the plurality of pixels SP. The color filter layer 190 may transmit only light, having a wavelength of a color corresponding to a corresponding pixel SP, of the white light emitted from the corresponding pixel SP.

In addition, in the light emitting diode display device according to the present embodiment, an adhesive member 305 disposed only between a floor surface 130a of a concave portion 130 and the light emitting device 300 may be replaced with the adhesive member 305 illustrated in FIG. 7. That is, in the present embodiment, the adhesive member 305 may be disposed between a first planarization layer 110 and a second planarization layer 140 and may be disposed between the first planarization layer 110 and the light emitting device 300.

Figure 10:
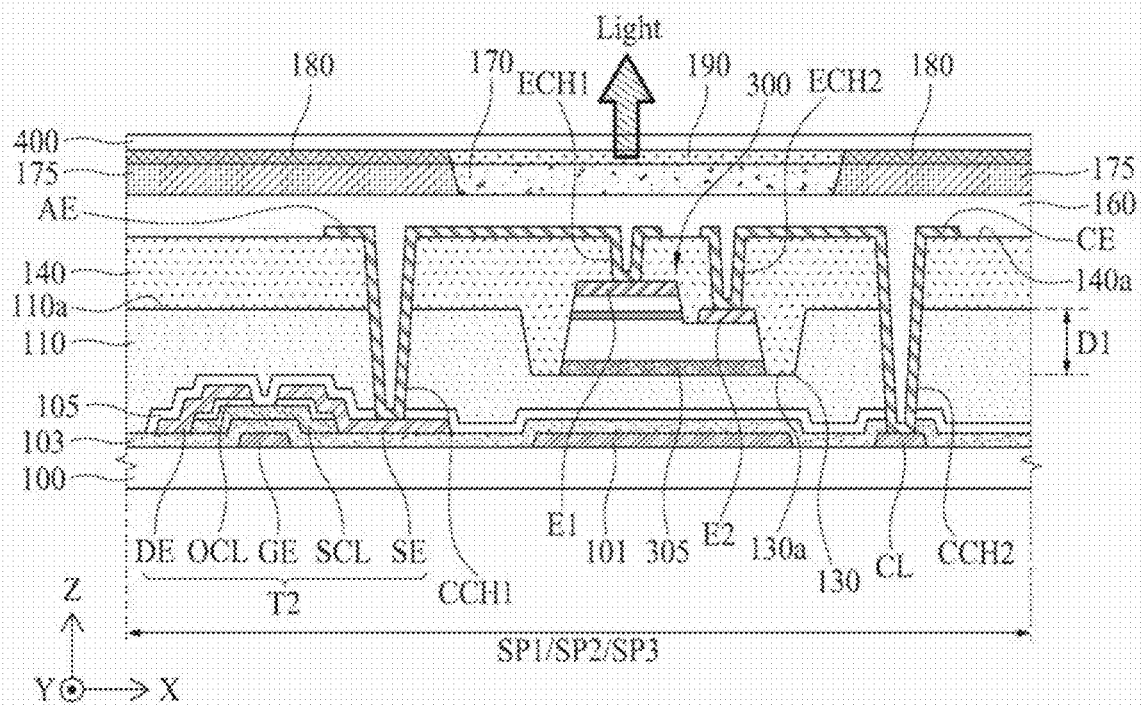

FIG. 10 is a diagram for describing a light emitting diode display device according to another embodiment of the present disclosure and is configured by adding a partition wall to the light emitting diode display device illustrated in FIG. 9. Hereinafter, therefore, the partition wall and elements associated thereto will be described.

Referring to FIG. 10, in the present embodiment, a partition wall 175 may be directly formed on a top of an encapsulation layer 160 to define an opening area overlapping a light emitting device 300 of each of a plurality of pixels SP. That is, the partition wall 175 may be directly formed on a top of the encapsulation layer 160 overlapping a light blocking area except an emissive area of each pixel SP and may define an opening area of each pixel SP. The partition wall 175 prevents or reduces color mixture between adjacent pixels SP.

Since the partition wall 175 is provided on the top of the encapsulation layer 160, the above-described wavelength conversion layer 170 may be directly formed on the top of the encapsulation layer 160 overlapping the opening area of each pixel SP defined by the partition wall 175. Accordingly, in the present embodiment, the partition wall 175 prevents or reduces color mixture between adjacent pixels SP, and the wavelength conversion layer 170 is provided on only the opening area of each pixel SP, thereby decreasing the material cost of the wavelength conversion layer 170.

Since the partition wall 175 is provided on the top of the encapsulation layer 160, the above-described black matrix 180 may be provide on a top of the partition wall 175 to have the same shape as that of the partition wall 175.

In addition, in the light emitting diode display device according to the present embodiment, an adhesive member 305 disposed only between a floor surface 130a of a concave portion 130 and the light emitting device 300 may be replaced with the adhesive member 305 illustrated in FIG. 7. That is, in the present embodiment, the adhesive member 305 may be disposed between a first planarization layer 110 and a second planarization layer 140 and may be disposed between the first planarization layer 110 and the light emitting device 300.

Figure 11:
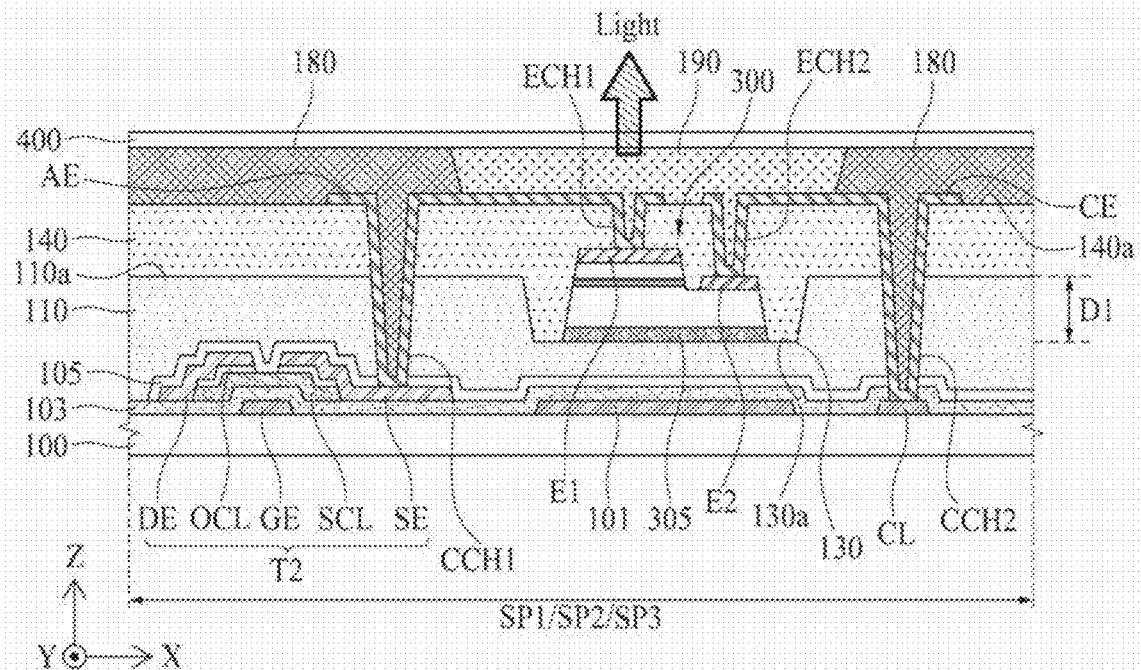

FIG. 11 is a diagram for describing a light emitting diode display device according to another embodiment of the present disclosure and illustrates an example where an encapsulation layer is configured with a black matrix and a color filter layer in the light emitting diode display device illustrated in FIG. 8. Hereinafter, therefore, the black matrix, the color filter layer, and elements associated thereto will be described.

Referring to FIG. 11, in the light emitting diode display device according to the present embodiment, a black matrix 180 may be directly provided on a first substrate 100 and may define an opening area overlapping an emissive area of each of a plurality of pixels SP. Also, the black matrix 180 fundamentally prevents or reduces color mixture between adjacent pixels SP, and thus, decreases a black luminance of the display device, thereby enabling the display device to realize real black. To this end, the black matrix 180 according to an embodiment may be formed to cover a second planarization layer 140, a pixel electrode AE, a common electrode CE, and first and second circuit contact holes CCH1 and CCH2 except a predetermined opening area and may define the opening area of each pixel SP. In more detail, except that the black matrix 180 is filled into each of the first and second circuit contact holes CCH1 and CCH2 and is directly formed on a top of each of the second planarization layer 140, the pixel electrode AE, and the common electrode CE, the black matrix 180 according to the present embodiment is the same as the black matrix illustrated in FIG. 7.

The color filter layer 190 may be directly formed on a top of each of the pixel electrode AE, the common electrode CE, and the second planarization layer 140 overlapping the opening area defined by the black matrix 180 and may include a red color filter, a green color filter, and a blue color filter corresponding to respective colors defined in the plurality of pixels SP. The color filter layer 190 may transmit only light, having a wavelength of a color corresponding to a corresponding pixel SP, of the white light emitted from the corresponding pixel SP.

In addition, in the light emitting diode display device according to the present embodiment, an adhesive member 305 disposed only between a floor surface 130a of a concave portion 130 and the light emitting device 300 may be replaced with the adhesive member 305 illustrated in FIG. 7. That is, in the present embodiment, the adhesive member 305 may be disposed between a first planarization layer 110 and the second planarization layer 140 and may be disposed between the first planarization layer 110 and the light emitting device 300.

In the light emitting diode display device according to the present embodiment, since the black matrix 180 is directly provided on the top of the second planarization layer 140, black luminance is reduced, and thus, real black is realized.

Figure 12:
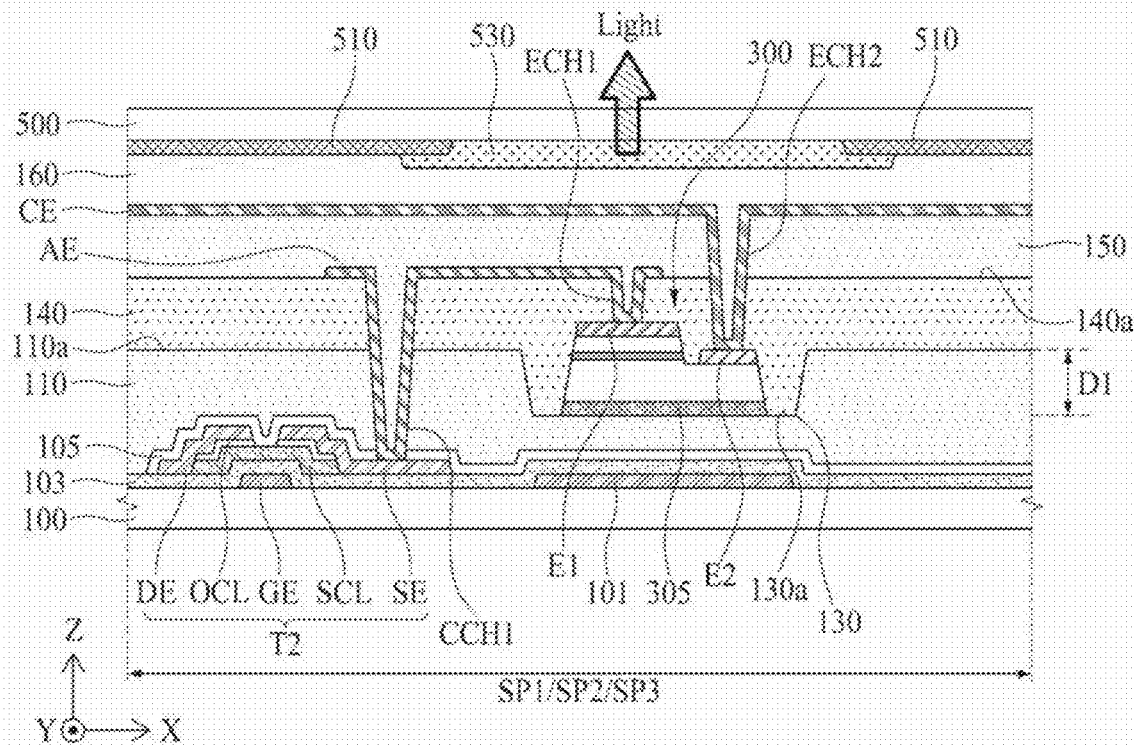

FIG. 12 is a diagram for describing a light emitting diode display device according to another embodiment of the present disclosure and illustrates an example where an encapsulation layer is configured by modifying a connection structure of a common electrode and a light emitting device in the light emitting diode display device illustrated in FIG.

3. Hereinafter, therefore, elements associated to the connection structure of the common electrode and the light emitting device will be described.

Referring to FIG. 12, the light emitting diode display device according to the present embodiment may include a plurality of pixels SP, a first planarization layer 110, a concave portion 130, a light emitting device 300, a second planarization layer 140, a pixel electrode AE, a third planarization layer 150, and a common electrode CE.

The plurality of pixels SP, the first planarization layer 110, the concave portion 130, the light emitting device 300, the second planarization layer 140, and the pixel electrode AE are the same as those of the light emitting diode display device illustrated in FIG. 3, and thus, their repetitive descriptions are not provided.

The third planarization layer 150 may be provided on the second planarization layer 140 to cover the pixel electrode AE. In this instance, the third planarization layer 150 may be formed of a material which is the same as that of the second planarization layer 140.

The common electrode CE may be electrically connected to a second electrode E2 of the light emitting device 300 and may be defined as a cathode electrode. The common electrode CE may be provided on the third planarization layer 150 overlapping the second electrode E2 of the light emitting device 300. The common electrode CE may be electrically connected to the second electrode E2 of the light emitting device 300 through a second electrode contact hole ECH2 which is provided to pass through the third planarization layer 150 and the second planarization layer 140.

The common electrode CE may be provided all over the third planarization layer 150 and may be electrically connected to the second electrode E2 of the light emitting device 300. That is, the common electrode CE may be provided in a whole display area defined on a first substrate 100 and may be connected in common to the second electrode E2 of the light emitting device 300 disposed in each of the plurality of pixels SP. Therefore, in the present embodiment, a resistance value of the common electrode CE is reduced. The common electrode CE may be formed of a transparent conductive material which is low in reflectivity.

The common electrode CE may be supplied with a common power from a panel driver through a pad part. Furthermore, the common electrode CE may be additionally supplied with the common power through a scan driving circuit. Therefore, in the present embodiment, the common power line CL and the second circuit contact hole CCH2 illustrated in FIG. 3 may be omitted.

The second electrode contact hole ECH2 may expose a portion or a whole portion of the second electrode E2 of the light emitting device 300. The second electrode contact hole ECH2 may be provided by removing the second planarization layer 140 and the third planarization layer 150 overlapping the portion or the whole portion of the second electrode E2 of the light emitting device 300 through a hole patterning process using a photolithography process and an etching process.

The light emitting diode display device according to the present embodiment may further include an encapsulation layer 160 that covers the common electrode CE.

The encapsulation layer 160 may be coated on the first substrate 100 to cover the common electrode CE and the second electrode contact hole ECH2, thereby protecting the pixel SP and the light emitting device 300 provided on the first substrate 100. The encapsulation layer 160 according to an embodiment may be an optical clear adhesive (OCA) or an optical clear resin (OCR), but is not limited thereto.

The light emitting diode display device according to the present embodiment may further include a second substrate 500 coupled to a top of the encapsulation layer 160.

The second substrate 500 may be disposed to cover a portion other than the pad part of the first substrate 100, thereby protecting a pixel array provided on the first substrate 100. The second substrate 500 may be defined as a color filter array substrate, an opposite substrate, or an encapsulation substrate. The second substrate 500 may include a black matrix 510 and a color filter layer 530. The black matrix 510 and the color filter layer 530 are the same as the black matrix and the color filter layer illustrated in FIG. 3, and thus, their repetitive descriptions are not provided.

In addition, the light emitting diode display device according to the present embodiment may be configured in combination with features of the light emitting diode display devices illustrated in FIGS. 5 to 11.

In the present embodiment, as illustrated in FIG. 5, the concave portion 130 may be provided in plurality, and the plurality of concave portions 130 may have different depths in respective pixels SP.

The light emitting diode display device according to the present embodiment may further include a wavelength conversion layer 170 illustrated in FIG. 6, and the wavelength conversion layer 170 may be provided between the encapsulation layer 160 and the second substrate 500.

In the present embodiment, an adhesive member 305 disposed only between a floor surface 130a of the concave portion 130 and the light emitting device 300 may be replaced with the adhesive member 305 illustrated in FIG. 7. That is, in the present embodiment, the adhesive member 305 may be disposed between the first planarization layer 110 and the second planarization layer 140 and may be disposed between the first planarization layer 110 and the light emitting device 300.

The light emitting diode display device according to the present embodiment, as illustrated in FIG. 8, may include a black matrix 180 and a color filter layer 190, which are provided on a top of the encapsulation layer 160, and a cover layer 400 which covers the black matrix 180 and the color filter layer 190, instead of the second substrate 500 bonded to the encapsulation layer 160. Furthermore, the light emitting diode display device according to the present embodiment may further include the wavelength conversion layer 170 illustrated in FIG. 9, and moreover, may further include the partition wall 175 illustrated in FIG. 10.

The light emitting diode display device according to the present embodiment, as illustrated in FIG. 11, may include the black matrix 180 and the color filter layer 190, instead of omitting the encapsulation layer 160.

Figure 13:
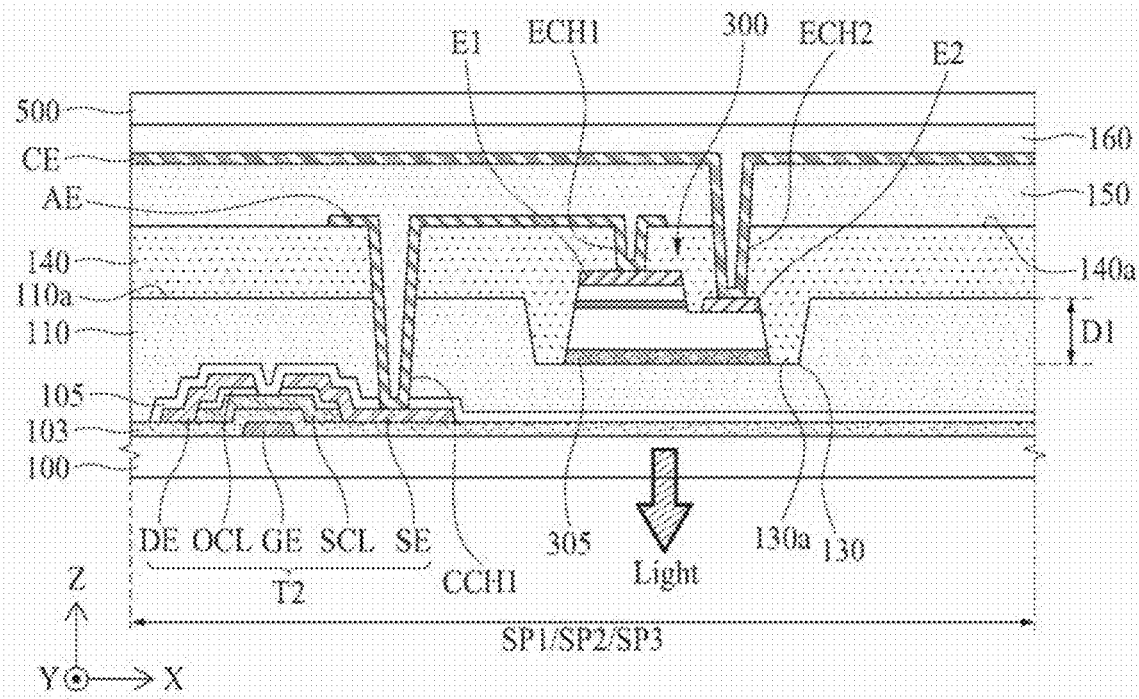

FIG. 13 is a diagram for describing a light emitting diode display device according to another embodiment of the present disclosure and illustrates an example where the light emitting diode display device illustrated in FIG. 12 is configured as a bottom emission type. Hereinafter, therefore, elements associated to the bottom emission type will be described.

Referring to FIG. 13, the light emitting diode display device according to the present embodiment may be configured by removing the black matrix and the color filter layer, which are provided on the second substrate 500, and the reflective layer 101 from the light emitting diode display device illustrated in FIG. 12, and a common electrode CE may be formed of a light reflection conductive material.

In the present embodiment, the common electrode CE may be formed of the light reflection conductive material which is high in reflectivity. For example, the common electrode CE may be formed of a single layer, including Al, Ag, Au, Pt, Cu, and/or the like, or a multilayer including a plurality of the single layers which are stacked.

Moreover, in the present embodiment, the second substrate 500 may be formed of a metal material, and the black matrix and the color filter layer provided on the second substrate 500 may be omitted. In this instance, a light emitting device 300 disposed in each pixel SP may emit light of a color corresponding to a color of a corresponding pixel.

Moreover, in the present embodiment, the reflective layer 101 provided on the first substrate 100 may be omitted for bottom emission.

Since the common electrode CE provided in a whole display area is formed of the light reflection conductive material, the light emitting diode display device according to the present embodiment may display an image in the bottom emission type.

As described above, according to the embodiments of the present disclosure, a process time taken in a process of connecting a light emitting device to a pixel circuit is considerably shortened, and thus, a productivity of light emitting diode display devices is enhanced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device comprising:
a substrate;
a gate line and a data line on the substrate;
a pixel connected to the gate line and the data line and including a thin film transistor (TFT) on the substrate;
a planarization layer on the TFT; and
a light emitting device including a first electrode and a second electrode,
wherein the light emitting device comprises a first portion and a second portion opposite to the first portion, the first portion including the first and second electrodes,
wherein the TFT comprises a gate electrode, a semiconductor layer, a source electrode, and a drain electrode, and
wherein the first portion of the light emitting device is not overlapped with the TFT.

2. The display device of claim 1, wherein the planarization layer includes at least one step portion.

3. The display device of claim 1, wherein the light emitting device is surrounded by the planarization layer.

4. The display device of claim 1, further comprising an adhesive member between the substrate and the light emitting device.

5. The display device of claim 1, further comprising a reflective layer between the substrate and the light emitting device.

6. The display device of claim 5, wherein a width of the reflective layer is greater than a width of the light emitting device.

7. The display device of claim 1, further comprising:
an adhesive member between the substrate and the light emitting device; and
a reflective layer between the substrate and the adhesive member.

8. The display device of claim 1, wherein a distance between the first portion and the substrate is greater than a distance between the second portion and the substrate.

9. The display device of claim 1, wherein the planarization layer covers the light emitting device, except for areas associated with the first and second electrodes.

10. The display device of claim 1, further comprising a black matrix defining an opening area overlapping with the light emitting device,
wherein the planarization layer includes a contact hole overlapping with the TFT, and
wherein the black matrix is provided in the contact hole.

11. The display device of claim 10, further comprising a color filter layer on the opening area.

12. The display device of claim 10, further comprising:
a color filter layer on the opening area; and
a cover layer covering the black matrix and the color filter layer.

13. The display device of claim 1, further comprising:
a pixel electrode electrically connected to the TFT and the first electrode of the light emitting device; and
a common electrode electrically connected to the second electrode of the light emitting device.

14. The display device of claim 13, wherein the planarization layer includes a contact hole overlapping with the TFT,
wherein the pixel electrode is electrically connected to the TFT through the contact hole.

15. The display device of claim 13, wherein the planarization layer comprises:
a first planarization layer on the TFT; and
a second planarization layer on the first planarization layer,
wherein the pixel electrode and the common electrode are on the second planarization layer.

16. The display device of claim 13, wherein:
the pixel electrode is electrically connected to the first electrode of the light emitting device through a first electrode contact hole,
the common electrode is electrically connected to the second electrode of the light emitting device through a second electrode contact hole, and
the first electrode contact hole and the second electrode contact hole have different depths.

17. The display device of claim 1, further comprising:
a driving power line on the substrate and supplying a pixel driving power to the pixel;
a common power line on the substrate and supplying a common power to the second electrode of the light emitting device.

18. The display device of claim 1, wherein the light emitting device is a light emitting diode device or a light emitting diode chip.

19. The display device of claim 1, further comprising an insulating layer between the source electrode of the TFT and the planarization layer.

20. The display device of claim 1, wherein the planarization layer comprises:
a first planarization layer on the TFT;
a second planarization layer on the first planarization layer; and
an adhesive member between the first planarization layer and the second planarization layer,
wherein the light emitting device is embedded or surrounded by the adhesive member and the second planarization layer.

* * * * *